US005121667A

United States Patent [19]

Emery et al.

[11] Patent Number: 5,121,667

[45] Date of Patent: Jun. 16, 1992

[54] ELECTRONIC MUSICAL INSTRUMENT WITH MULTIPLE VOICES RESPONSIVE TO MUTUALLY EXCLUSIVE RAM MEMORY SEGEMENTS

[76] Inventors: Christopher L. Emery, 1549 Second St., Cuyahoga Falls, Ohio 44221; Timothy Ricks, 1118 Roslyn, Akron, Ohio 44320

[21] Appl. No.: 432,232

[22] Filed: Nov. 6, 1989

[51] Int. Cl.[5] .......................... G10H 7/00; G10H 5/00; G11C 00/00; H03B 00/00

[52] U.S. Cl. .......................................... 84/603; 84/645; 84/671

[58] Field of Search .................. 84/601, 602, 603-607, 84/617, 645, 647, 655, 671, 678, 682, 622

[56] References Cited

U.S. PATENT DOCUMENTS

| | | | |
|---|---|---|---|
| 3,742,145 | 6/1973 | Clark et al. . | |
| 3,969,682 | 7/1976 | Rossum . | |
| 3,986,423 | 10/1976 | Rossum | 84/682 |
| 4,067,254 | 1/1978 | Deutsch et al. . | |
| 4,193,332 | 3/1980 | Richardson . | |
| 4,201,105 | 5/1980 | Alles . | |
| 4,320,683 | 3/1982 | Whitefield . | |
| 4,338,843 | 7/1982 | Wise . | |
| 4,343,216 | 8/1982 | Swain et al. . | |
| 4,343,218 | 8/1982 | Futamase . | |
| 4,404,529 | 9/1983 | Rossum et al. . | |
| 4,495,846 | 1/1985 | Williams . | |
| 4,506,579 | 3/1985 | Rossum . | |
| 4,584,921 | 4/1986 | Wachi | 84/605 |
| 4,667,566 | 5/1987 | Hanzawa et al. | 84/603 |
| 4,748,887 | 6/1988 | Marshall . | |
| 4,777,857 | 10/1988 | Stewart . | |
| 4,833,963 | 5/1989 | Hayden et al. . | |
| 4,922,794 | 5/1990 | Shibukawa | 84/622 X |
| 4,924,745 | 5/1990 | Kimpara et al. | 84/609 |

OTHER PUBLICATIONS

"Sounds and Images", In Depth Sound and Image Processing, Dec. 1989, BYTE, pp. 243-248, (Author-Gene Smarte).

*Primary Examiner*—William M. Shoop, Jr.
*Assistant Examiner*—Jeffrey W. Donels
*Attorney, Agent, or Firm*—Fay, Sharpe, Beall, Fagan, Minnich & McKee

[57] ABSTRACT

A multi-channel musical instrument/computer comprising a mass memory device connected to a plurality of random access memory divisions, each random access memory division connected to an oscillator bank to produce musical sounds from multiple sources simultaneously. A MIDI interface is provided to connect to another instrument or system for the reproduction and/or storage of musical sounds. A ROM card interface is provided to collect and/or play musical sounds stored on ROM cards supplied by various manufacturers.

7 Claims, 5 Drawing Sheets

ELECTRONIC MUSICAL INSTRUMENT WITH MULTIPLE VOICES RESPONSIVE TO MUTUALLY EXCLUSIVE RAM MEMORY SEGEMENTS

BACKGROUND OF THE INVENTION

This invention relates generally to the art of electronic instrumentation and, more particularly, to an electronic musical instrument wherein oscillator sets and multiple voices are each assigned a unique PCM data channel for sound production.

Most synthesizers, samplers, or drum machines available on the market today provide the user with a maximum of approximately 32 oscillators or voices. Currently, music manufacturers typically assign all PCM data in internal memory, which is being "played" by a keyboard, to one set of oscillators. For example, PCM data or "samples" from several musical instruments are assigned to one group of oscillators, usually having a maximum of 32 oscillators in that one group.

The standard design creates a problem for keyboard players since when all oscillators (voices) are triggered at one moment in time, no more notes will be played from the device. In other words, for a 32 oscillator device, once 32 keys are depressed simultaneously on the keyboard, no more will play. Also, if sounds are layered on top of one another, such as a piano chord on top of an organ chord, the maximum number of notes or voices playable declines with each note played. For example, a three note piano chord layered on top of a three note organ chord uses six oscillators or voices, leaving only 26 playable notes left from the original 32. This decline of available voices is the cause of "note drop out" that occurs when keyboards are connected via a standardized musical instrument digital interface (MIDI) and the "Note On" number exceeds the number of voices available in the musical device.

BRIEF SUMMARY OF THE INVENTION

The subject invention remedies the above-referenced problems and others, and provides a system which overcomes the limitations inherent in assigning all PCM data held in memory to a single oscillator set. The subject invention also teaches a system to eliminate the "note drop out" problem associated with the existing electronic musical instruments.

In accordance with the present invention, a group of oscillators is dedicated to one portion of memory containing PCM data to the exclusion of the remaining PCM data area, so that a bank of oscillators plays its own specific PCM data exclusively, even though there are other sounds (PCM DATA) assigned to a specific portion of the MIDI keyboard. In addition, each oscillator bank is assigned its own MIDI channel. The present invention thus assigns samples, or groups comprising an "instrument", to one dedicated oscillator bank only, while the remaining sample data in internal memory is assigned exclusively to other oscillator banks.

An advantage of the present invention is the provision of a system with which multiple input sources may be accessed and played concurrently. For example, PCM data may be played on one oscillator set assigned to MIDI channel 1, while another oscillator set plays different PCM data (different sounds) assigned to MIDI channel 2. The computer musical instrument of the present invention is expandable to simultaneously play multiple MIDI channels, play multiple PCM data segments, receive a MIDI "data dump", and refresh other memory segments with more, or fill other memory segments with new, PCM data.

Yet another advantage of the present invention is the provision of a computer/musical instrument which allows the user to play with much greater polyphony than ever before. By increasing the number of voices available, i.e., greater than the 64 limit today, the user can play many more notes simultaneously as desired.

Further advantages will be apparent to one of ordinary skill in the art and upon a reading and understanding of the subject specification.

BRIEF DESCRIPTION OF THE DRAWINGS

The invention may take physical form in certain parts and arrangements of parts, a preferred embodiment of which will be described in detail in this specification and illustrated in the accompanying drawings wherein.

DETAILED DESCRIPTION OF THE INVENTION

Figure 1:
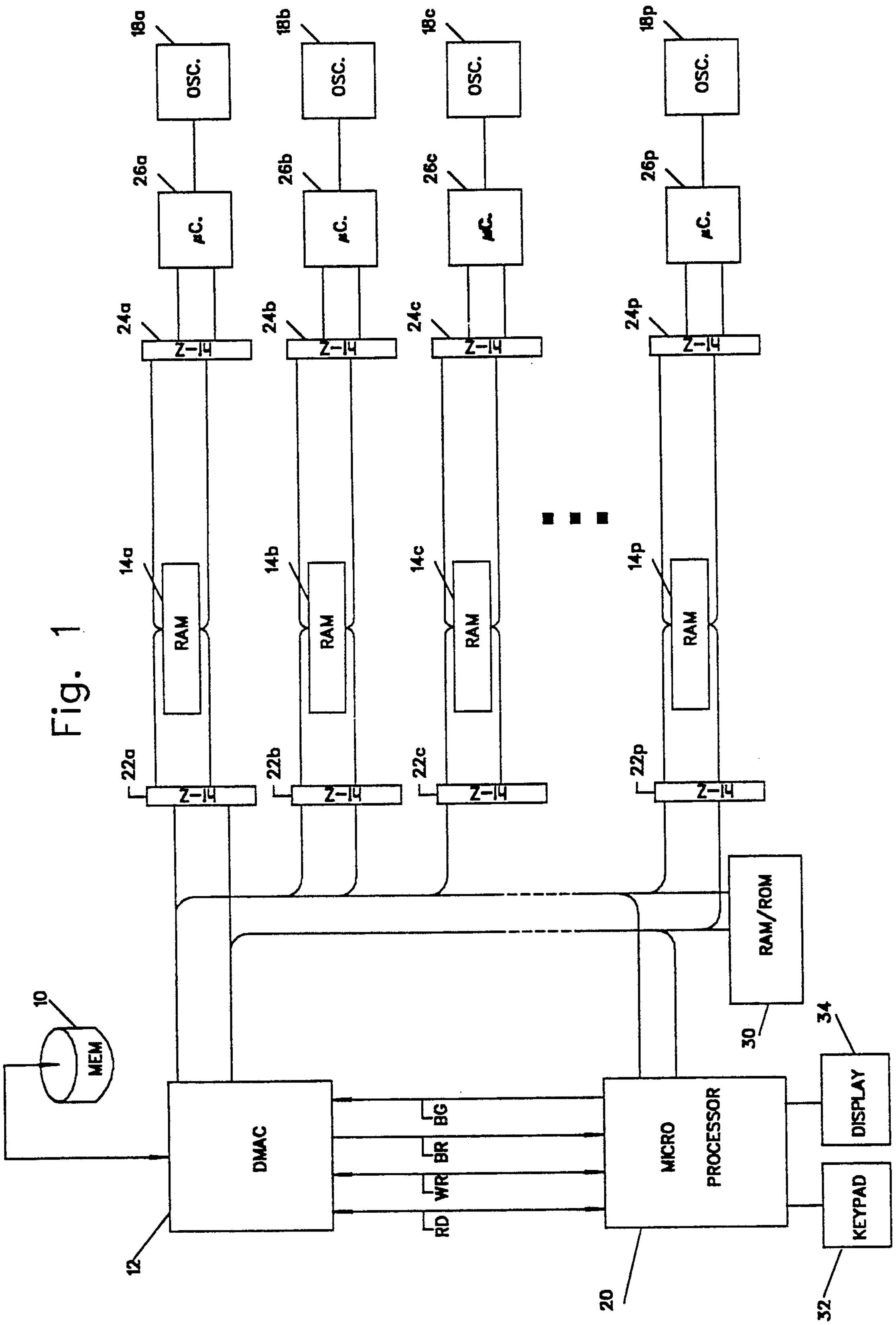
FIG. 1 is an overall schematic block diagram of an embodiment of the present invention.

Referring now to the drawings wherein the showings are for the purpose of illustrating the preferred embodiment of the invention only, and not for the purpose of limiting the same.

FIG. 1 illustrates a first embodiment of an electronic computer/musical instrument of the present invention in the form of a sample "stacker." The apparatus comprises a mass memory storage device 10 connected to a direct memory access controller ("DMAC") 12. The mass memory storage device 10 suitably includes a hard disk drive, a CD ROM, an optical read/write CD interface, a floppy disk drive, or the like. The mass memory storage device 10 enables an operator to input into the apparatus pulse code modulation ("PCM") data representative of musical sounds. Digital sampler disks are available in libraries from various manufacturers. These serve to load the data into the mass memory storage device 10.

To effect a sample "stacker," à number of random access memory RAM divisions 14*a*–14*p* are provided. Each RAM division is assigned to one bank of oscillators 18*a*–18*p*. Under a musician's direction, data contained in the mass memory storage device 10 is suitably loaded into selected RAM divisions 14*a*–14*p* by the DMAC 12 to be played by the various oscillator banks 18*a*–18*p*.

By way of example, an operator may load sixteen different PCM data portions into the mass memory storage device 10, each portion consisting of a sample, or groups of samples, taken from a musical "instrument." Data representative of a guitar is suitably loaded into RAM division 1, 14*a*, data representative of a piano is suitably loaded into RAM division 2, 14*b*, and data representative of an organ is suitably loaded into RAM division 3, 14*c*. In the apparatus shown in the FIGURE, up to sixteen instruments may be loaded into the sixteen different RAM divisions 14a–14p, each RAM division being assigned to one oscillator set within the oscillator bank.

A microprocessor 20 is provided to control the DMAC 12. The microprocessor 20 uses bidirectional read lines RD and bidirectional write lines WR to respectively read and write control data from and to the DMAC 12. Upon receiving a transfer command from the microprocessor 20, the DMAC 12 sets the bus request signal BR high. The microprocessor 20 may grant access to the bus by setting the bus grant BG line high. The DMAC 12 executes the instructions sent by the microprocessor 20 through the bidirectional write data lines WR, to transfer PCM data contained in the mass memory storage device 10 to one of the multiple RAM divisions 14a–14p. Upon completion of the memory transfer, the DMAC 12 lowers the bus request BR signal line to the microprocessor 20. The microprocessor 20, in turn, lowers the bus grant BG grant to the DMAC 12, whereupon additional instructions may be issued to the DMAC 12 through the bidirectional read RD and write WR signal lines.

To avoid bus contention problems, tri-state gates are provided between the DMAC 12 and the RAM divisions 14a–14p. Similarly, tri-state gates are provided between the RAM divisions 14a–14p and the oscillator banks 18a–18p. Tri-state gates 22a–22p and 24a–24p provide a high impedance barrier upon a signal received from the microprocessor 20 to isolate the address and data lines of the DMAC 12 from the address and data lines of the RAM divisions 14a–14p. The tri-state gates 22a–22p are controlled by the microprocessor 20 to direct the flow of information from the DMAC 12 to one of the number of RAM divisions 14a–14p.

By way of example, to transfer a single set of PCM data from the mass memory storage device 10, the microprocessor 20 writes a control word to the DMAC 12 through the bidirectional write lines WR, instructing the DMAC 12 where to find the PCM data within the mass memory storage device 10. When the DMAC 12 is ready to execute the instruction, the bus request signal BR is raised by the DMAC 12. The microprocessor 20 then sends a signal to the tri-state gates 22a–22p to control the flow of information into the RAM divisions 14a–14p. For the purpose of this example, it is assumed that RAM division 1, 14a is a target of the information.

Before raising the bus grant signal BG, the microprocessor 20 sends a signal to the tri-state gates 22a–22p placing them in a high impedance state, with the exception of tri-state gate 22a. The effect of this is that the PCM data is routed to RAM division 1, 14a. Upon raising the bus grant signal BG, the DMAC 12 writes the data from the mass memory storage device 10 to the RAM divisions through the address and data buses with RAM division 1, 14a being the only RAM division receiving data because of the setting of tri-state gates 22a–22p.

A second set of tri-state gates 24a–24p are provided between the RAM divisions 14a–14p and oscillator banks 18a–18p. The second set of tri-state gates 24a–24p are also controlled by the microprocessor 20 to ensure that no bus contention problems arise within the system. The second set of tri-state gates 24a–24p work in conjunction with the first set of tri-state gates 22a–22p to isolate the RAM divisions 14a–14p from each other while the apparatus simultaneously accesses the contents of the various RAM divisions 14a–14p.

Each oscillator set within the oscillator bank is controlled by a microcontroller. For example, oscillator set 18a is controlled by microcontroller 26a. The microcontroller 26a reads data from the RAM division 1. 14a, and provides the information therein to the oscillator set 18a. To ensure that no bus contention problems arise, the microprocessor 20 controls the tri-state gates 22a and 24a to coordinate access to the RAM division 1 14a between the DMAC 12 and the microcontroller 26a. The microprocessor 20 controls the tri-state gates 22a and 24a in a manner such that at no point in time are tri-state gates 22a or 24a both in a low impedance state.

The microprocessor 20 executes instructions contained in the system control memory 30. Also contained in the system control memory 30 are operator variables which provide parameters of operation for the microprocessor 20. An operator suitably inputs operator variables through a keypad 32 to the system control memory 30 and also read system status and various information through an LED display 34.

In the sample "stacker" shown in FIG. 1, an operator may input sixteen different sets of PCM data into the mass storage device 10. The operator may then direct the microprocessor 20 to load each of the sixteen sets of PCM data to a different RAM division 14a–14p through the keypad device 32. To execute the command, the microprocessor first sequentially loads each of the RAM divisions 14a through 14p with a different set of PCM data held in the mass memory storage device 10.

To do this, the microprocessor 20 first writes control words to the DMAC 10 through the bidirectional write data lines WR. Upon receiving a bus request signal BR from the DMAC 12, the microprocessor 20 first places all tri-state gates 22a–22p and 24a–24p in a high impedance state except for tri-state gate 22a. When this is done, the microprocessor will grant the bus to the DMAC 12 by raising the bus grant BG signal line. The DMAC 12, in turn, transfers the first set of PCM data from the mass memory device 10 to the common data bus which is, in effect, directed to RAM division 1, 14a through tri-state gate 22a. No data is transferred to RAM divisions 14b–14p as access to those RAM divisions is not possible due to a high impedance state of tri-state gates 22b–22p. Upon completion of the data transfer, the DMAC 12 lowers the bus request BR signal to the microprocessor 20 whereupon the microprocessor 20 sequentially controls the transfer of PCM data to the remaining RAM divisions 14b–14p.

When all RAM divisions 14a–14p have been filled, the microprocessor 20, in turn, places the tri-state gates 22a–22p in a high impedance state and the tri-state gates 24a–24p in a low impedance state. A start pulse is then issued to each of the microcontrollers 26a–26p. Each microcontroller 26a–26p reads data from its associated RAM division 14a–14p and provides a signal to its associated oscillator bank 18a–18p to reproduce the sixteen separate single sets of PCM data simultaneously through the oscillator sets 18a–18p. The result is a "stacking" or "layering" of the single sets of PCM data.

Figure 2:
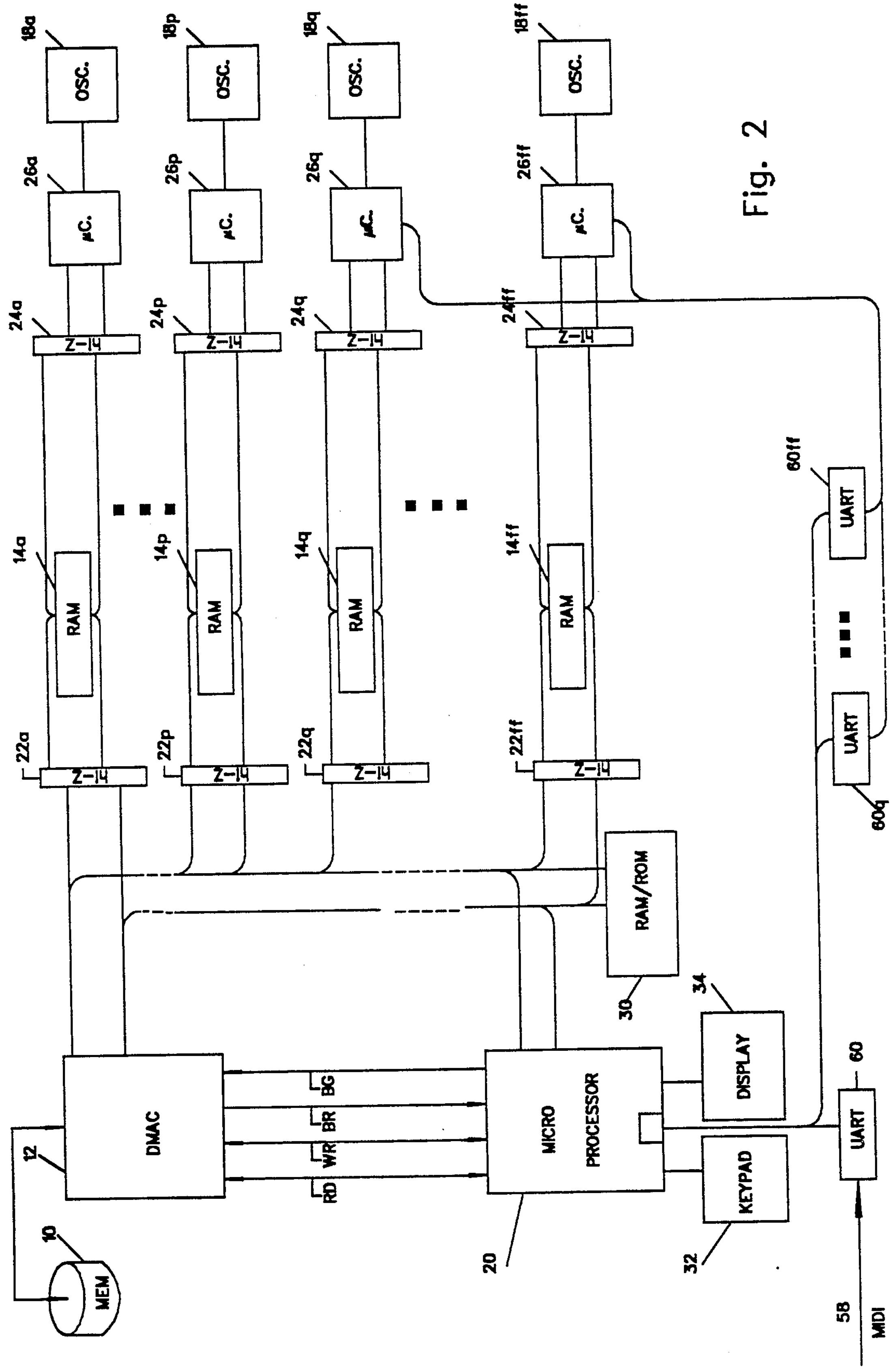
FIG. 2 is an overall schematic block diagram of another embodiment of the present invention.

Referring now to FIG. 2, the "sample stacker" of FIG. 1 is enhanced through the addition of a musical instrument digital interface channel MIDI for the communication of information from an associated musical instrument or musical instrument system. The MIDI input 58 is received into the apparatus of the present invention through a universal asynchronous receive/-transmit device ("UART") 60. The microprocessor 20 receives the information from the UART 60 and processes it, directing information to one of the oscillator sets 18*q*–18*ff*. Each of the MIDI information 58 contains channel information upon which the microprocessor 20 may make a decision in routing the information to the oscillator sets 18*q*–18*ff*. Each of the sixteen oscillator sets 18*q*–18*ff* is dedicated to a single and separate MIDI channel whereby sixteen channels may be played by the apparatus of the present invention simultaneously. Further, the first eight oscillator sets 18*a*–18*p* may simultaneously play PCM data stored in RAM divisions 14*a*–14*p* simultaneous with the playing of the eight MIDI channels.

In the embodiment shown in FIG. 2, the microcontrollers 26*q*–26*ff* are chosen to accept the serial transmission of MIDI information from the microprocessor 20 through an associated UART 60*q*–60*ff*. The microcontrollers read either the PCM data contained in the RAM divisions 14*q*–14*ff* or the serial MIDI data sent from UARTS 60*q*–60*ff* depending upon the state of discrete I/) lines (not shown) set by the microprocessor 20. The tri-state gates 24*q*–24*ff* are held in a high impedance state as the microprocessor 20 sends the serial MIDI information through UARTS 60*q*–60*ff* to the microcontrollers 26*q*–26*ff*. Meanwhile, music may be played and data transferred as described above in the explanation of the "sample stacker" of FIG. 1. Since each MIDI channel is assigned its own oscillator bank 18*q*–18*ff*, and each PCM data set stored in RAM divisions 14*a*–14*p* is assigned its own oscillator set 18*a*–18*p*, a virtual thirty-two track, thirty-two timbrel recording can be produced, particularly if each oscillator bank has its own stereo/audio outputs.

Figure 3:
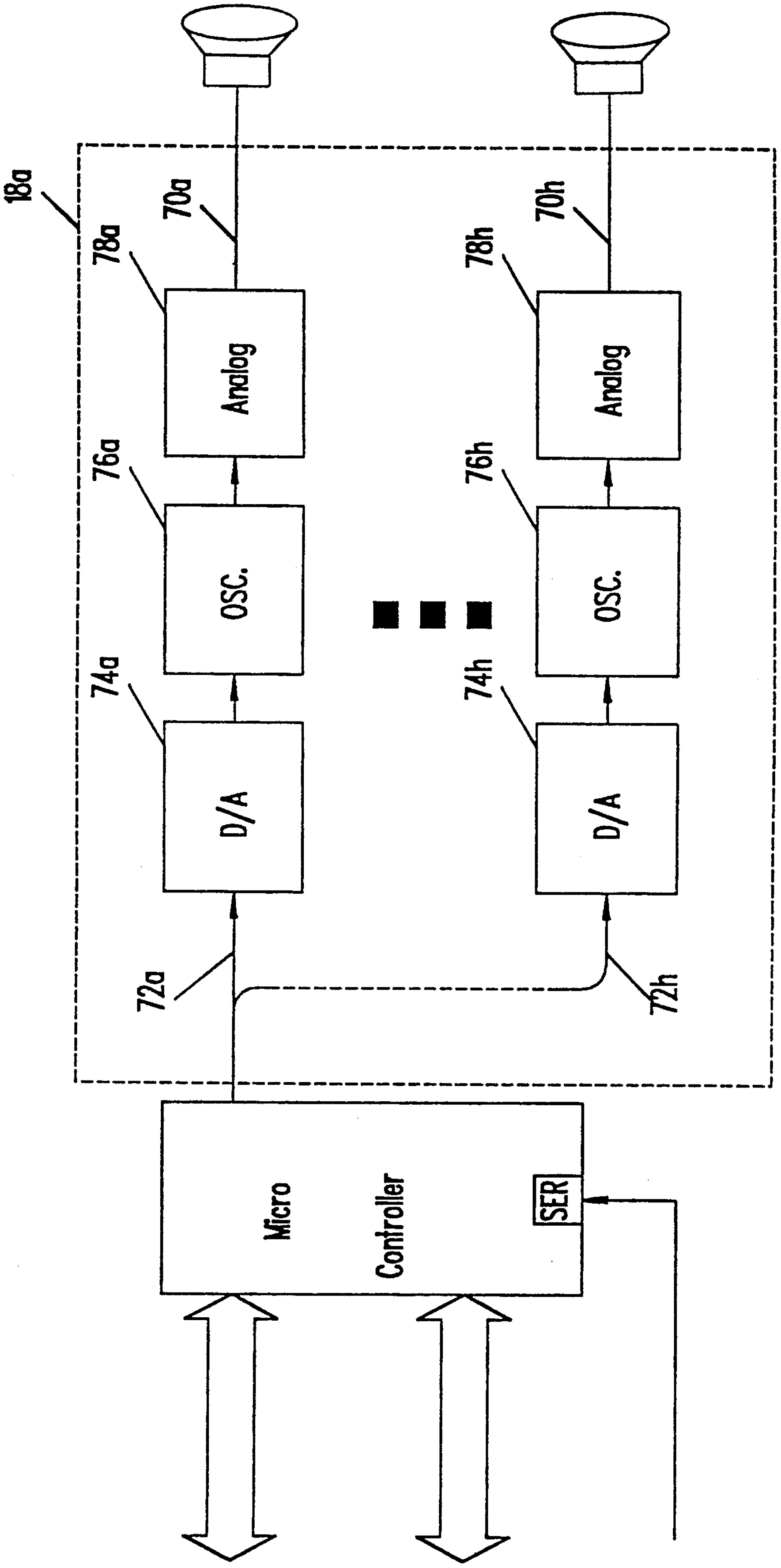
FIG. 3 is an overall schematic block diagram of an oscillator bank of the present invention.

FIG. 3 shows an oscillator set 18*a* in detail. In the illustrated structure, each oscillator set suitably includes eight audio outputs 70*a*–70*h*. The signals received into the oscillator sets comprise voltage signals 72*a*–72*h* produced by a single microcontroller 26. For example, the first oscillator set 18*a* receives voltage signals 72*a*–72*h* from the microcontroller 26*a* to drive the eight audio outputs 70*a*–70*h*. The voltage signals 72*a*–72*h* are fed to a digital-to-analog converter 74*a*–74*h*, then to an oscillator 76*a*–76*h* where a sinusoid is produced based upon a linear relationship between the voltage level received from the digital-to-analog converter and a reference frequency. The signals from the oscillators 76*a*–76*h* are further modified by an analog processing circuit 78*a*–78*h* to drive the audio outputs 70*a*–70*h*.

Figure 4:
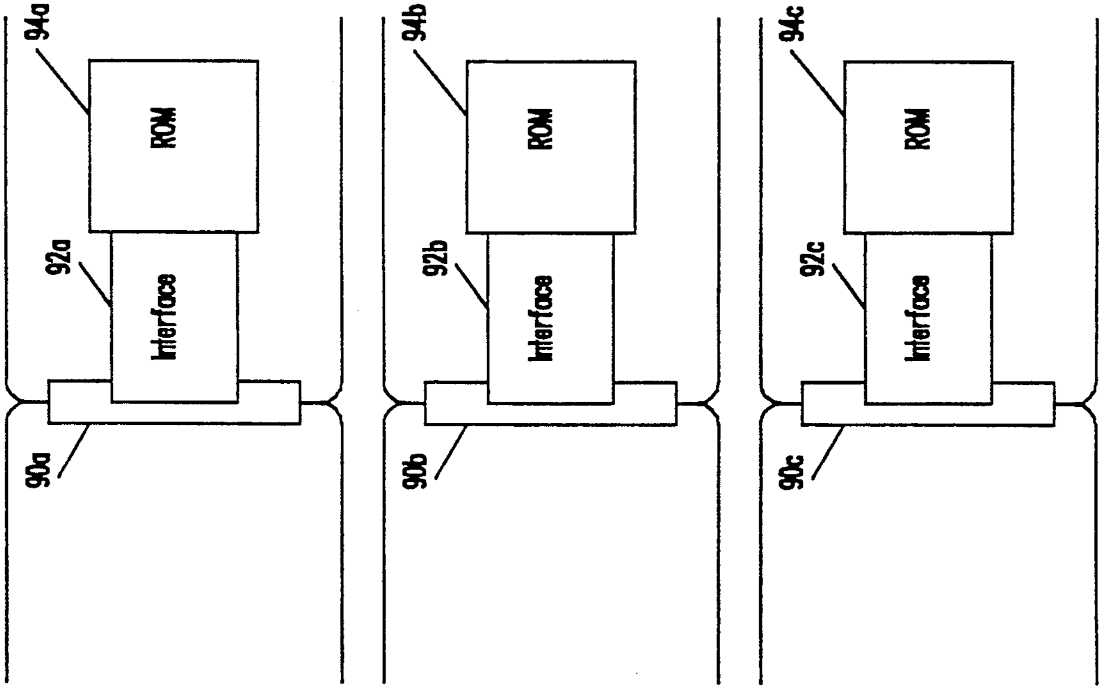
FIG. 4 is an overall schematic block diagram of yet another embodiment of the present invention.

FIG. 4 shows a device having a number of ROM card slots 90*a*–90*c* provided to enable various ROM cards 94*a*–94*c* from different manufacturers to be read by the device. An interface 92*a*–92*c* is provided to map the various ROM cards from different manufacturers into the memory area accessible by the microprocessor 20 of the device. Each interface 92*a*–92*c* may contain various gates to decode and translate the address of the data contained in the various ROM cards from different manufacturers to an address amenable to the present system.

The PCM data contained in the ROM cards 94*a*–94*c* from different manufacturers and inserted into ROM card slots 90*a*–90*c* may be read and stored into the mass memory storage device 10 using the apparatus of the present invention. To read from ROM card 1, 94*a*, the microprocessor 20 must first place the tri-state gate 24*a* in a high impedance state while placing tri-state gate 22*a* in a low impedance state. An instruction sent by the microprocessor 20 to the DMAC 12 through bidirectional data write line WR instructs the DMAC 12 where to place the PCM data within the mass memory storage device 10. The DMAC 12, in turn, raises the bus request signal BR whereupon a bus grant signal BG is returned to start the data transfer from the ROM card in the first slot to the mass memory storage device 10. Upon successful completion, the bus request signal BR is dropped by the DMAC 12 indicating the end of the data transfer.

Figure 5:
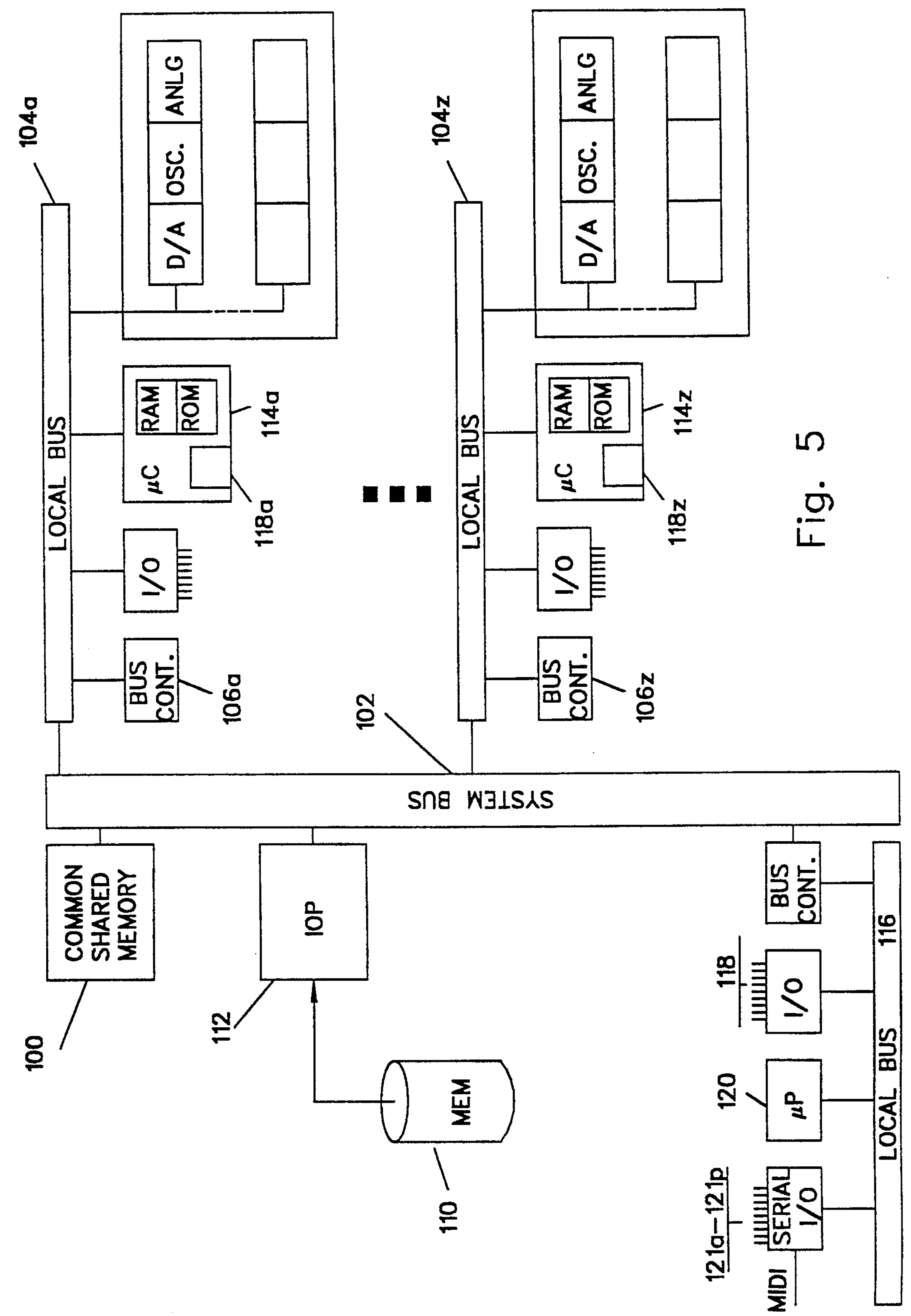
FIG. 5 is an overall schematic block diagram of still yet another embodiment of the present invention.

FIG. 5 shows a multiprocessor system or a multiple computer system having a single shared memory area 100 connected to a common system bus 102. A number of local buses 104*a*–104*p* are connected to the system bus 102 through system bus controllers 106*a*–106*p*. A mass memory storage device 110 is connected to the system bus 102 through a dedicated input/output processor IOP 112. By virtue of being connected to the system bus 102, the mass memory storage device 110 is available to each microcontroller 114*a*–114*p* in the system. A microprocessor 120 is connected to local bus 116 and provides for the control of the entire system through discrete I/) lines 118 available to each of the microcontrollers 114*a*–114*p* to determine system bus 102 priorities and to determine each microcontroller's input data source. That is, each microcontroller 114*a*–114*p* has the ability to receive data through the system bus 102, from either the common shared memory 100 or the mass memory device 110, or to receive serial MIDI data through the serial input port 118*a*–118*p* on each microcontroller from the system UARTS 121*a*–121*p*.

Other forms of multiprocessor organizations are possible, such as a crossbar switch or a time-shared common bus scheme as appreciated by one having ordinary skill in the art.

It will now be apparent to those of reasonable skill in the art that other embodiments, improvements, enhancements, and other changes can be made to the present apparatus consistent with the above specification and within the scope of this patent, which is limited only by the following claims or the equivalents thereof.

Having thus described the invention, it is now claimed:

1. An electronic computer/musical instrument comprising:

a first audio data memory means for storing a plurality of sets of first audio data, each set representative of a plurality of musical notes;

a plurality of second memory means for storing a plurality of sets of second audio data, each second memory means storing a single set of second audio data and each set of second audio data representative of a plurality of musical notes;

a memory transfer means for communicating preselected sets of the first audio data from the first audio data memory means to a preselected one of the plurality of second memory means;

a plurality of oscillator groups, each oscillator group including a plurality of oscillator means for generating an audio signal;

a plurality of data transfer means for communicating each set of second audio data to a unique one of the oscillator groups;

a central processing means for controlling the memory transfer means, in accordance with a preselected computer program executed by the central processing means, and in accordance with preselected operator input variables;

a first control data memory means, local to the central processing means, for storing the operator input variables;

an operator input means for inputting the operator input variables to the first control data memory means;

a second control data memory means, local to the central processing means, for storing the preselected computer program executed by the central processing means;

an operator output means for outputting a status of the electronic computer/musical instrument;

a musical instrument digital interface channel means, local to the central processing means, for receiving MIDI signals from an associated data processing device, the MIDI signals being representative of a plurality of musical notes and command codes;

an asynchronous serial data transfer means, operatively associated with the central processing means and with the plurality of data transfer means, for communicating the MIDI signals to one of the plurality of oscillator groups based upon the command codes and based upon selected operator input variables;

an oscillator group control means, driven by the central processing means, for controlling each of the plurality of data transfer means to communicate to each of the plurality of oscillator groups one of either a set of second audio data held in one of the plurality of second memory means, or a MIDI signal communicated from the asynchronous serial data transfer means, based upon selected operator input variables and upon the preselected computer program, the oscillator group control means including a plurality of discrete output bit lines, set by the central processing means, based upon the preselected computer program and upon selected operator variables, each discrete output bit line providing a signal to each one of the plurality of data transfer means indicative of a data input source to each one of the plurality of data transfer means.

2. The electronic computer/musical instrument of claim 1 wherein the oscillator group control means further includes a plurality of buffer means for interfacing the plurality of second memory means with the plurality of oscillator groups, each of the buffer means providing a high impedance isolation interface between one of the plurality of second memory means and one of the plurality of oscillator groups.

3. An electronic computer/musical instrument comprising:

a first audio data memory means for storing a plurality of sets of first audio data, each set representative of a plurality of musical notes;

a plurality of second memory means for storing a plurality of sets of second audio data, each second memory means storing a single set of second audio data and each set of second audio data representative of a plurality of musical notes;

a memory transfer means for communicating preselected sets of the first audio data from the first audio data memory means to a preselected one of the plurality of second memory means;

a plurality of oscillator groups, each oscillator group including a plurality of oscillator means for generating an audio signal;

a plurality of data transfer means for communicating each set of second audio data to a unique one of the oscillator groups;

a central processing means for controlling the memory transfer means, in accordance with a preselected computer program executed by the central processing means, and in accordance with preselected operator input variables;

a first control data memory means, local to the central processing means, for storing the operator input variables;

an operator input means for inputting the operator input variables to the first control data memory means;

a second control data memory means, local to the central processing means, for storing the preselected computer program executed by the central processing means;

an operator output means for outputting a status of the electronic computer/musical instrument;

a musical instrument digital interface channel means, local to the central processing means, for receiving MIDI signals from an associated data processing device, the MIDI signals being representative of a plurality of musical notes and command codes;

an asynchronous serial data transfer means, operatively associated with the central processing means and with the plurality of data transfer means, for communicating the MIDI signals to one of the plurality of oscillator groups based upon the command codes and based upon selected operator input variables;

an oscillator group control means, driven by the central processing means, for controlling each of the plurality of data transfer means to communicate to each of the plurality of oscillator groups one of either a set of second audio data held in one of the plurality of second memory means, or a MIDI signal communicated from the asynchronous serial data transfer means, based upon selected operator input variables and upon the preselected computer program, each one of the plurality of data transfer means including a microcomputer means for sequentially transferring a set of second audio data from an associated one of the plurality of second memory means to an associated one of the plurality of oscillator groups and for transferring a MIDI signal, received from the asynchronous serial data transfer means, to an associated one of the plurality of oscillator groups.

4. The electronic computer/musical instrument of claim 3 wherein each one of the plurality of data transfer means includes a discrete input bit line for discriminating an input source for data transfer to an associated one of the plurality of oscillator groups.

5. A multi-mode musical instrument comprising:

a plurality of oscillator sets, each oscillator set including a plurality of oscillator means for generating an audio signal responsive to audio data;

first control means for mapping each of the oscillator sets to a dedicated musical instrument digital interface channel as a mapped layout;

memory means for storing operator variables;

operator variable input means for inputting the operator variables into the memory means;

MIDI message receiving means for receiving a plurality of MIDI messages from an associated electrically connected MIDI device;

data routing means for routing a first one of the MIDI messages from the message receiving means to a first one of the plurality of oscillator sets based upon i) the operator variables, ii) the mapped lay-out, and iii) channel data contained in the one MIDI message; and, means for converting the first one MIDI message into said audio data for use by the first one oscillator set for generating a first audio signal.

6. The multi-mode musical instrument according to claim 5 wherein the data routing means further comprises means for routing MIDI messages other than the first one MIDI message to oscillator sets other than the first one oscillator set.

7. The multi-mode musical instrument according to claim 6 wherein the data routing means comprises means for singly routing each of the plurality of MIDI messages to a unique one oscillator set.

* * * * *

UNITED STATES PATENT AND TRADEMARK OFFICE

CERTIFICATE OF CORRECTION

PATENT NO. : 5,121,667

DATED : June 16, 1992

INVENTOR(S) : Emery et al

It is certified that error appears in the above-indentified patent and that said Letters Patent is hereby corrected as shown below:

On the title page, item [76] Inventors: please delete the following:

--Timothy Ricks, 1118 Roslyn, Akron, Ohio 44320-- as a co- inventor.

Signed and Sealed this

Fifth Day of April, 1994

Attest:

BRUCE LEHMAN

*Attesting Officer* *Commissioner of Patents and Trademarks*